United States Patent
Laven et al.

(10) Patent No.: US 9,640,401 B2
(45) Date of Patent: May 2, 2017

(54) METHOD OF MANUFACTURING A SEMICONDUCTOR DEVICE HAVING A REAR-SIDE INSERT STRUCTURE

(71) Applicant: Infineon Technologies AG, Neubiberg (DE)

(72) Inventors: Johannes Georg Laven, Taufkirchen (DE); Hans-Joachim Schulze, Taufkirchen (DE); Anton Mauder, Kolbermoor (DE); Erich Griebl, Dorfen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/188,472

(22) Filed: Jun. 21, 2016

(65) Prior Publication Data

US 2016/0300719 A1    Oct. 13, 2016

Related U.S. Application Data

(62) Division of application No. 14/180,924, filed on Feb. 14, 2014, now Pat. No. 9,385,222.

(51) Int. Cl.
*H01L 21/20* (2006.01)
*H01L 29/739* (2006.01)
(Continued)

(52) U.S. Cl.
CPC .... *H01L 21/26513* (2013.01); *H01L 21/0265* (2013.01); *H01L 21/02532* (2013.01);
(Continued)

(58) Field of Classification Search
CPC ........... H01L 21/2254; H01L 21/02647; H01L 21/26533; H01L 21/3247; H01L 23/544; H01L 21/6835; H01L 21/02639; H01L 21/02642; H01L 21/0265; H01L 21/02532; H01L 29/7395; H01L 29/36; H01L 29/16;
(Continued)

(56) References Cited

U.S. PATENT DOCUMENTS 6,403,451 B1    6/2002  Linthicum et al.
6,498,048 B2    12/2002 Morita
(Continued)

OTHER PUBLICATIONS

Chen, Weizhong et al., "A High Reliable Reverse-Conducting IGBT with a Floating P-plug", Proceedings of the 25th International Symposium on Power Semiconductor Devices and ICs, Kanazawa, May 26-30, 2013, 265-268.
(Continued)

*Primary Examiner* — Savitr Mulpuri
(74) *Attorney, Agent, or Firm* — Murphy, Bilak & Homiller, PLLC

(57) ABSTRACT

A method of manufacturing a semiconductor device includes forming a cavity in a first semiconductor layer formed on a semiconducting base layer, the cavity extending from a process surface of the first semiconductor layer at least down to the base layer, forming a recessed mask liner on a portion of a sidewall of the cavity distant to the process surface or a mask plug in a portion of the cavity distant to the process surface, and growing a second semiconductor layer on the process surface by epitaxy, the second semiconductor layer spanning the cavity.

10 Claims, 12 Drawing Sheets

(51) Int. Cl.

| | | |
|---|---|---|
| *H01L 21/265* | (2006.01) | |
| *H01L 21/02* | (2006.01) | |
| *H01L 21/225* | (2006.01) | |
| *H01L 21/306* | (2006.01) | |
| *H01L 21/324* | (2006.01) | |
| *H01L 29/04* | (2006.01) | |
| *H01L 29/06* | (2006.01) | |
| *H01L 29/10* | (2006.01) | |
| *H01L 29/16* | (2006.01) | |
| *H01L 29/36* | (2006.01) | |
| *H01L 29/66* | (2006.01) | |
| *H01L 23/544* | (2006.01) | |
| *H01L 21/683* | (2006.01) | |
| *H01L 29/861* | (2006.01) | |
| *H01L 21/3065* | (2006.01) | |

(52) U.S. Cl.
CPC .. *H01L 21/02595* (2013.01); *H01L 21/02598* (2013.01); *H01L 21/02636* (2013.01); *H01L 21/02639* (2013.01); *H01L 21/02642* (2013.01); *H01L 21/02647* (2013.01); *H01L 21/02667* (2013.01); *H01L 21/2251* (2013.01); *H01L 21/2254* (2013.01); *H01L 21/2257* (2013.01); *H01L 21/26533* (2013.01); *H01L 21/3065* (2013.01); *H01L 21/30604* (2013.01); *H01L 21/30625* (2013.01); *H01L 21/324* (2013.01); *H01L 21/3247* (2013.01); *H01L 21/6835* (2013.01); *H01L 23/544* (2013.01); *H01L 29/04* (2013.01); *H01L 29/0619* (2013.01); *H01L 29/0623* (2013.01); *H01L 29/0634* (2013.01); *H01L 29/0649* (2013.01); *H01L 29/0653* (2013.01); *H01L 29/0661* (2013.01); *H01L 29/0696* (2013.01); *H01L 29/1095* (2013.01); *H01L 29/16* (2013.01); *H01L 29/36* (2013.01); *H01L 29/66333* (2013.01); *H01L 29/66348* (2013.01); *H01L 29/7395* (2013.01); *H01L 29/7397* (2013.01); *H01L 29/8611* (2013.01); *H01L 2221/6834* (2013.01); *H01L 2221/68327* (2013.01); *H01L 2223/5446* (2013.01); *H01L 2223/54426* (2013.01); *H01L 2924/0002* (2013.01)

(58) Field of Classification Search
CPC ............ H01L 29/1095; H01L 29/0696; H01L 29/063; H01L 21/324; H01L 21/26513; H01L 21/2251; H01L 21/02667; H01L 21/02636; H01L 21/02595; H01L 29/66333; H01L 21/30625; H01L 29/8611; H01L 29/66348; H01L 29/7397; H01L 29/0623
See application file for complete search history.

(56) References Cited

U.S. PATENT DOCUMENTS

| | | |
|---|---|---|
| 6,677,173 B2 | 1/2004 | Ota |
| 6,818,463 B2 | 11/2004 | Biwa et al. |
| 6,939,730 B2 | 9/2005 | Goto et al. |
| 7,425,507 B2* | 9/2008 | Lake ................ H01L 21/30655 257/E21.259 |
| 7,619,261 B2 | 11/2009 | Koide |
| 7,691,732 B2 | 4/2010 | Okahisa et al. |
| 9,112,053 B2* | 8/2015 | Weber ............. H01L 21/823437 |
| 2005/0035405 A1 | 2/2005 | Mauder et al. |
| 2007/0023830 A1* | 2/2007 | Pfirsch ................ H01L 29/0634 257/341 |
| 2008/0036030 A1 | 2/2008 | Villa et al. |
| 2010/0117144 A1* | 5/2010 | Hirler .................. H01L 29/407 257/330 |
| 2013/0320487 A1 | 12/2013 | Mauder et al. |

OTHER PUBLICATIONS

Jiang, Huaping et al., "A Snapback Suppressed Reverse-Conducting IGBT With a Floating p-Region in Trench Collector", IEEE Electron Device Letters, vol. 33, No. 3, IEEE Electron Devices Society, Mar. 2012, 417-419.

Zhu, Liheng et al., "A Novel Snapback-Free Reverse Conducting IGBT with Anti-parallel Shockley Diode", Proceedings of the 25th International Symposium on Power Semiconductor Devices & ICs, Kanazawa, May 26-30, 2013, 261-264.

\* cited by examiner

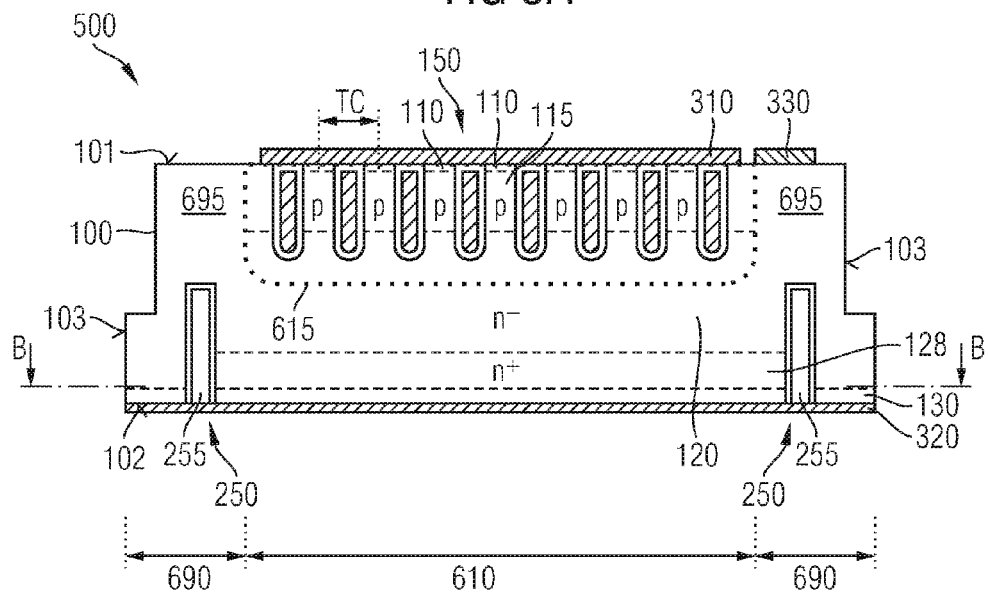
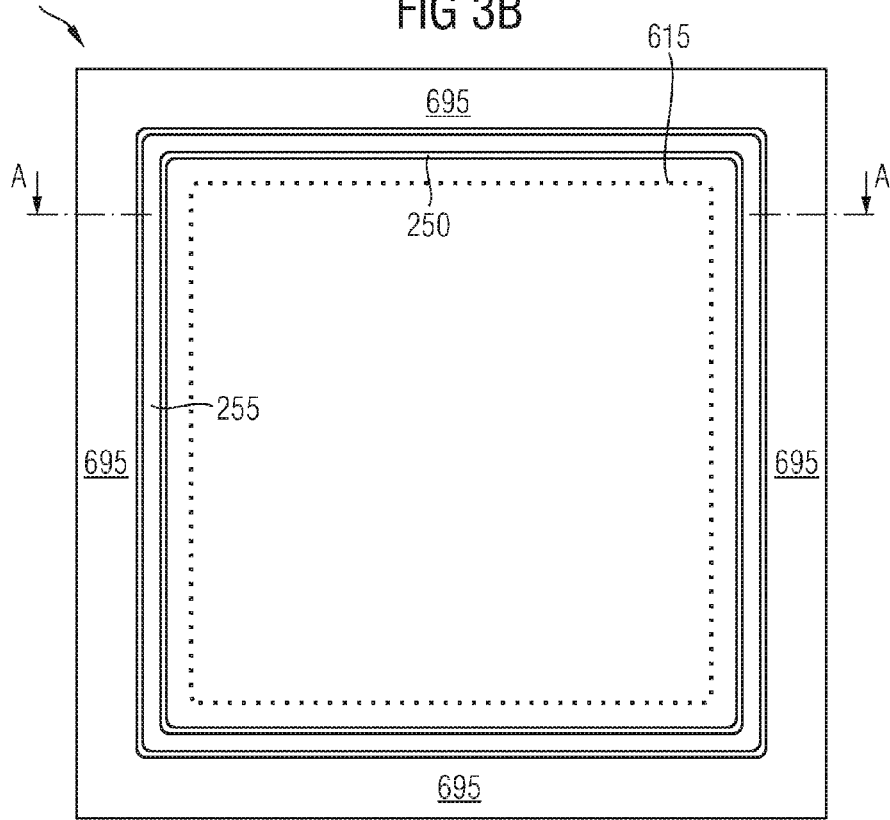

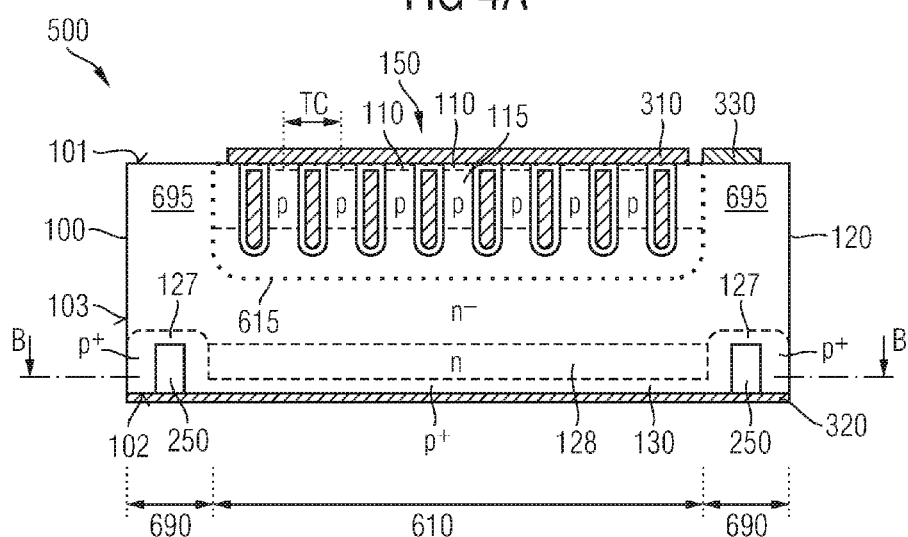
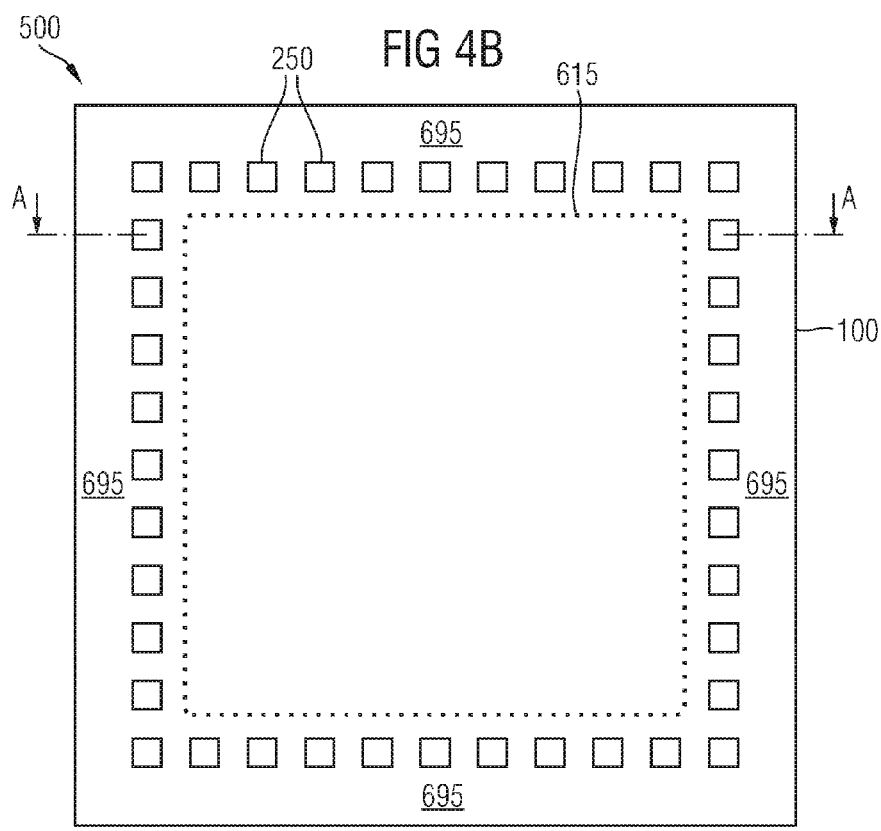

METHOD OF MANUFACTURING A SEMICONDUCTOR DEVICE HAVING A REAR-SIDE INSERT STRUCTURE

BACKGROUND

The manufacture of semiconductor devices includes formation of conductive and dielectric structures as well as the formation of impurity zones predominantly at a front side of a semiconductor substrate such as a silicon wafer. Formation of dielectric structures and patterned impurity zones on a rear side subsequent to a processing on the wafer front side is subject to strict process constraints. For example, the thermal budget available for rear side processing may be limited resulting in further restrictions as regards applicable materials. It is desirable to provide a method of manufacturing semiconductor devices that simplifies the formation of patterned structures at the wafer rear side as well as to provide semiconductor devices with patterned rear sides.

SUMMARY

An embodiment refers to a method of manufacturing a semiconductor device. The method includes forming a cavity in a first semiconductor layer that is formed on a semiconducting base layer. The cavity extends from a process surface of the first semiconductor layer to the base layer. A recessed mask liner is formed on a portion of a sidewall of the cavity distant to the process surface or a mask plug is formed in a portion of the cavity distant do the process surface. A second semiconductor layer is grown by epitaxy on the process surface, wherein the second semiconductor layer spans the cavity.

According to another embodiment a semiconductor device includes a semiconductor body with a first surface at a front side and a second surface parallel to the first surface at a rear side as well as an active area and an edge termination area. The edge termination area separates the active area from an outer surface of the semiconductor body, wherein the outer surface connects the first and second surfaces. Element structures in the active area are predominantly formed closer to the first surface than to the second surface. A rear side insertion structure extends from the second surface into the semiconductor body in the edge termination area.

According to another embodiment a semiconductor device includes a semiconductor body with a first surface at a front side and a second surface parallel to the first surface at a rear side. Element structures are predominantly formed closer to the first surface than to the second surface. An insertion structure extends from the second surface into the semiconductor body, wherein the insertion structure includes a phase change material, a recombination structure with a recombination velocity of at least 1E5 cm/s, acceptor impurities or donator impurities.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3A is a schematic cross-sectional view of a portion of a semiconductor device in accordance with an embodiment providing a rear side insertion structure in an edge termination area.

FIG. 3B is a schematic lateral cross-sectional view of the semiconductor device of FIG. 3A.

FIG. 4A is a schematic cross-sectional view of a portion of a semiconductor device in accordance with an embodiment with a rear side insertion structure increasing reverse blocking capability.

FIG. 4B is a schematic lateral cross-sectional view of the semiconductor device of FIG. 4A.

DETAILED DESCRIPTION

Figure 1A:
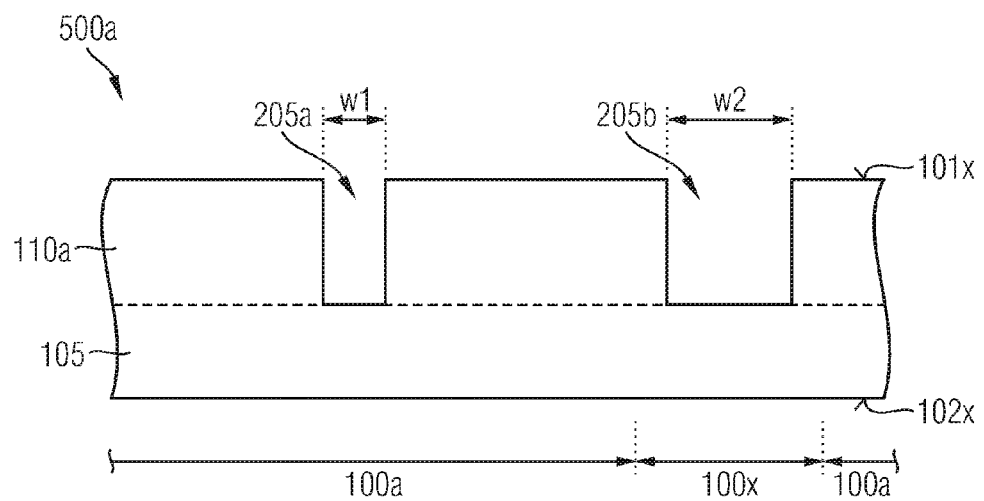
FIG. 1A is a schematic cross-sectional view of a portion of a semiconductor substrate for illustrating a method of manufacturing a semiconductor device according to an embodiment concerning alignment marks, after forming cavities in a first semiconductor layer formed on a base layer.

In the following detailed description reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be electrically arranged between the electrically coupled elements, for example elements that provide a low-ohmic connection in a first state and a high-ohmic electric decoupling in a second state.

The Figures illustrate relative doping concentrations by indicating "−" or "+" next to the doping type "n" or "p". For example, "n−" indicates a region with a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1E refer to a method of forming rear side insertion structures as well as alignment marks for aligning front side structures to the rear side insertion structures.

A first semiconductor layer 110a is grown by epitaxy on a semiconducting base layer 105. The base layer 105 is a layer or layer structure of single-crystalline semiconductor material, e.g., silicon (Si), germanium (Ge), a silicon germanium crystal (SiGe), silicon carbide (SiC), gallium arsenide (GaAs), gallium nitride (GaN) or another $A_{III}B_V$ semiconductor. The base layer 105 may be a homogeneous layer or may include a base substrate and an epitaxial layer grown by epitaxy on the base substrate, wherein the base substrate and the epitaxial layer may differ in the conductivity type and/or the impurity concentration. The crystal lattice of the first semiconductor layer 110a grows in registry with the crystal lattice of the base layer 105.

One or more first and second cavities 205a, 205b may be formed in a process surface 101x of the first semiconductor layer 110a opposite to the base layer 105. For example, a hard mask may be formed on the process surface 101x by a photolithography process and the cavities 205a, 205b may be etched by reactive ion beam etching, wherein the cavities 205a, 205b may extend into the base substrate. According to other embodiments, the cavities 205a, 205b may be formed by locally masking the epitaxial growth of the first semiconductor layer 110a.

FIG. 1A shows first and second cavities 205a, 205b extending from the process surface 101x to the base layer 105. The first cavity 205a may be formed in a functional portion 100a of the semiconductor substrate 500a which forms part of a semiconductor body of a finalized semiconductor device obtained from a semiconductor substrate 500a including the base layer 105 and the first semiconductor layer 110a. The second cavity 205b may be formed in a kerf portion 100x, which is consumed or removed during a separation process for obtaining a plurality of identical semiconductor dies including the functional portions 100a. The first and second cavities 205a, 205b may reach or may extend into the base layer 105, respectively.

A first width w1 of the first cavity 205a may be smaller than a second width w2 of the second cavity 205b. The cavities 205a, 205b may be lined with a mask liner 203, which may consist of or include one or more dielectric layer(s) such as silicon oxide, siliconoxynitride, silicon nitride and/or diffusion barrier layer(s) such as titanium (Ti), titanium nitride (TiN), tantalum (Ta), tantalum nitride (TaN) or tungsten W. The mask liner 203 may completely fill the first cavity 205a or both cavities 205a, 205b or may leave voids. A further material may fill the first cavity 205a or both cavities 205a, 205b partly or completely.

A second semiconductor layer 120a is formed on the process surface 101x of the first semiconductor layer 110a. The second semiconductor layer 120a spans the first cavity 205a but does not grow or at least leaves a void in the vertical projection of the second cavity 205b.

According to an embodiment growing the second semiconductor layer 120a includes capping the first cavity 205a with the material of the first semiconductor layer 110a and then growing the second semiconductor layer 120a by epitaxy on the first semiconductor layer 110a. Capping the first cavity 205a may include fluidifying and then recrystallizing portions of the first semiconductor layer 110a. According to another embodiment, capping the first cavity 205a may include an epitaxy process at process conditions supporting a sufficient lateral growth.

An extended cavity formed by the second cavity 205b and a corresponding void in the second semiconductor layer 120a in the vertical projection of the second cavity 205b may or may not be partly or completely filled with a contrast material 219, for example silicon oxide, a dielectric polymer, a phase change material, or polycrystalline silicon.

Figure 1B:
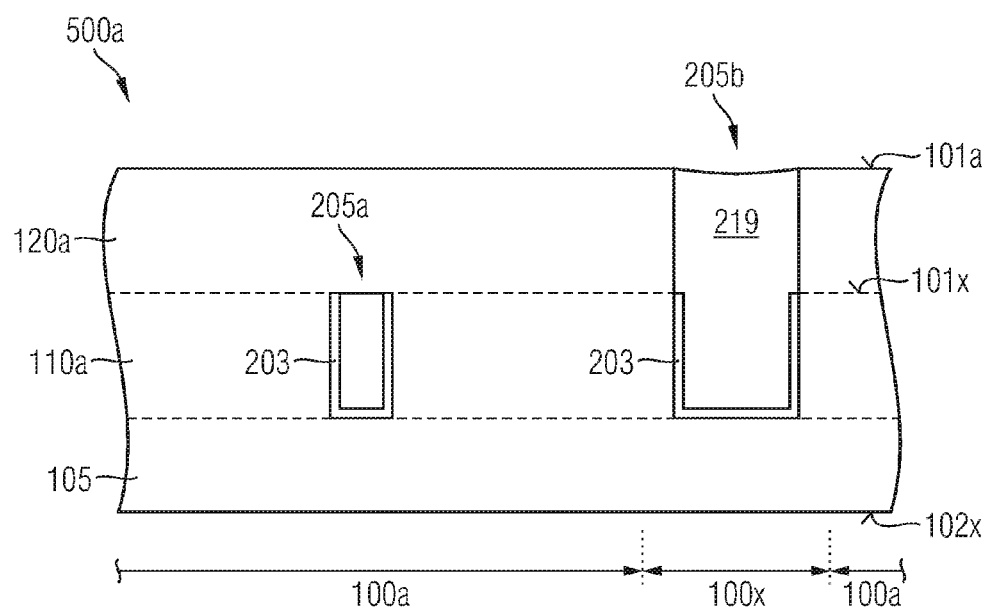
FIG. 1B is a schematic cross-sectional view of the semiconductor substrate portion of FIG. 1A after growing by epitaxy a second semiconductor layer on the first semiconductor layer.

FIG. 1B shows the second semiconductor layer 120a spanning and covering the first cavity 205a. The second semiconductor layer 120a may be completely absent in the vertical projection of the second cavity 205b, may leave a void narrower than the second cavity 205b, or may overgrow the second cavity 205b, wherein grain boundaries may be formed in the vertical projection of the second cavity 205b.

The base layer 105 is partly or completely removed using a wet etch process, a grinding process, or a polishing process, for example CMP (chemically-mechanically polishing), wherein the semiconductor substrate 500a is thinned and the first cavities 205a, the second cavities 205b or both or material in the interior of at least the first cavities 205a, the second cavities 205 or both is exposed.

Figure 1C:
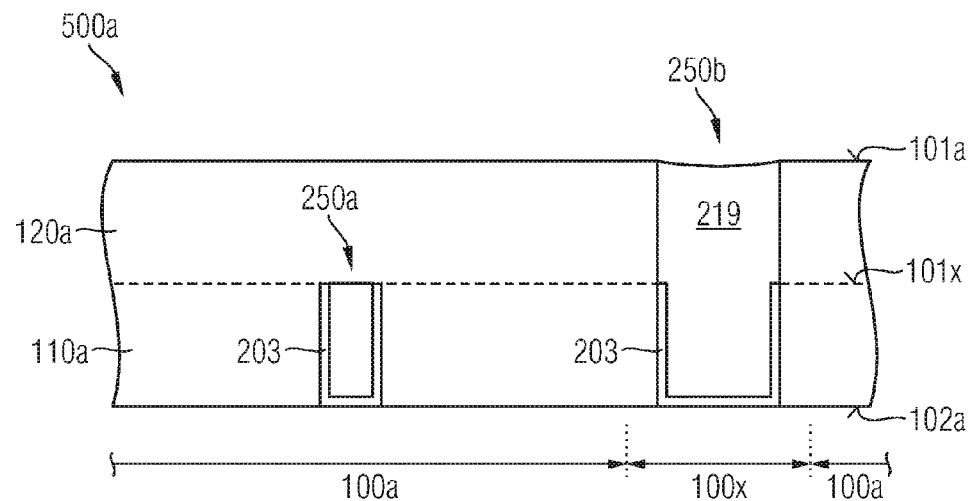
FIG. 1C is a schematic cross-sectional view of the semiconductor substrate portion of FIG. 1B after removing the complete base layer.
Figure 1D:
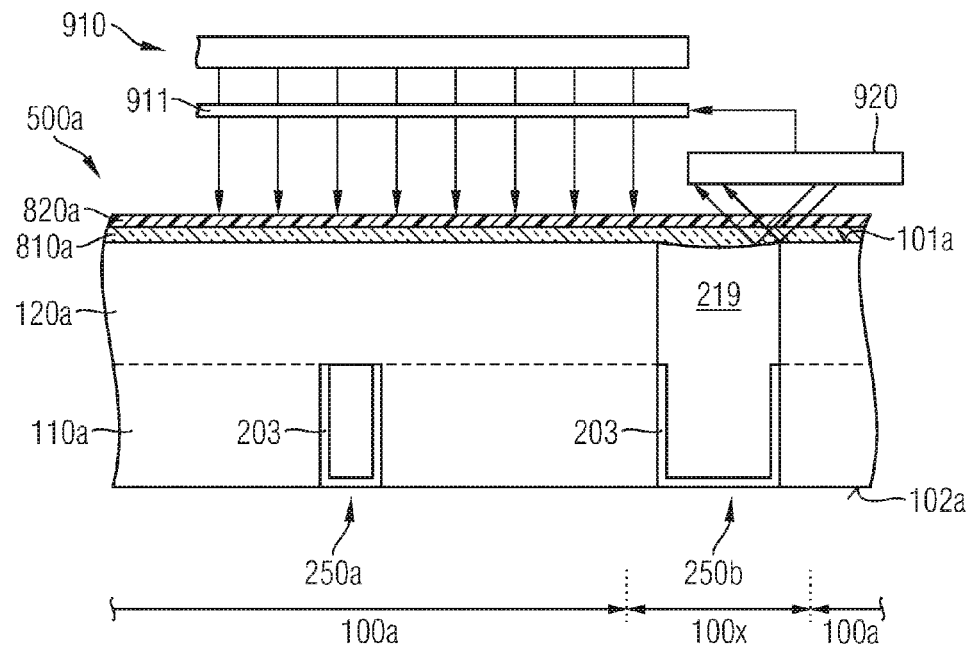
FIG. 1D includes a schematic cross-sectional view of the semiconductor substrate portion of FIG. 1C during exposure of a photoresist layer.

FIG. 1C shows the thinned semiconductor substrate 500a with the exposed surface of the second semiconductor layer 120a forming a first surface 101a on a front side of the semiconductor substrate 500a and the opposed surface of the first semiconductor layer 110a exposed by the grinding or polishing process forming a second surface 102a at the rear side. The first and second surfaces 101a, 102a are substantially parallel to each other. A distance between the first and second surfaces 101a, 102a may be at least 20 µm, for example at least 45 µm and may range up to several 100 µm. In the functional portion 100a, a rear side insertion structure 250a resulting from the first cavity 205a extends from the second surface 102a into the semiconductor substrate 500a that includes the first and second semiconductor layers 110a, 120a. An alignment mark 250b resulting from the second cavity 205b extends through the semiconductor substrate 500a from the first to the second surface 101a, 102a.

A mask layer 810a may be deposited on the first surface 101a. A resist layer 820a may be deposited on the mask layer 810a. A registration system 920 evaluates the position of the alignment mark 250b. For example, the registration system 920 emits light which incidents on the first surface 101a at an angle of, e.g., about 45 degree and evaluates light reflected from the semiconductor substrate 500a, inter alia light reflected and/or scattered at interfaces between the alignment mark 250b and the second semiconductor layer 120a. On the basis of position information about the alignment mark 250b a photolithography apparatus 910 aligns an illumination mask 911 to the semiconductor substrate 500a. A light beam emitted by the photolithography apparatus 910 and passing through or being reflected at the illumination mask 911 exposes sections of the photoresist layer 820a defined by a mask pattern of the illumination mask 911.

The exposed photoresist layer 820a is developed, wherein either the exposed or the unexposed sections of the photoresist layer 820a are removed. Remnant sections of the photoresist layer 820a form a resist mask used as an etch mask for patterning the mask layer 810a or may be used as an implantation mask.

Figure 1E:
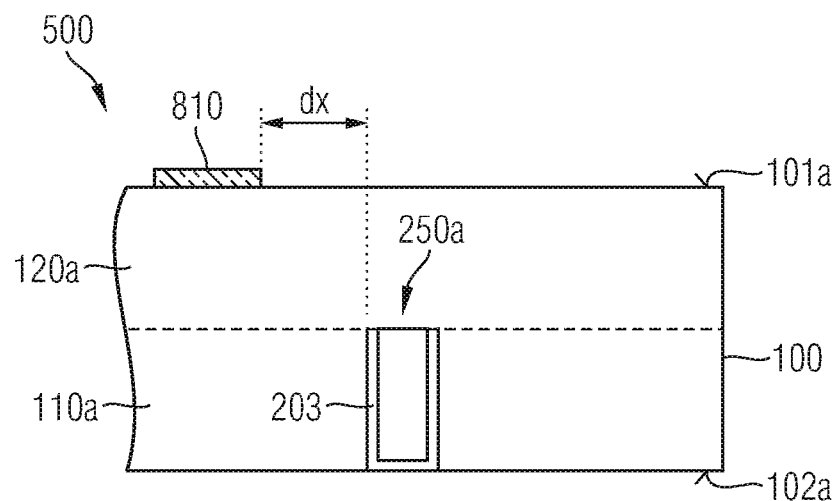
FIG. 1E is a schematic cross-sectional view of the semiconductor substrate portion of FIG. 1D after forming a front side structure aligned to a rear side insertion structure.

FIG. 1E shows a front side structure 810 obtained by patterning the mask layer 810a. The front side structure 810 may be a temporary etch or implantation mask or a functional structure of the finalized device. The rear side insertion structure 250a is aligned to the front side structure 810 and structures formed by using the front side structure 810 as etch or implantation mask. A distance dx between edges of the rear side insertion structure 250a and the front side structure 810 can be well defined. The method allows aligning structures on the front side to structures on the rear side within alignment tolerances which are not greater than the alignment tolerances between structures obtained by two independent photolithography processes at the same side. Since the rear side insertion structure 250a is formed before the front side is processed, a wide range of materials and processes is applicable for the rear side insertion structure 250a.

According to another embodiment the second cavity 205b of FIG. 1B is a circumferential cavity surrounding an active chip area including semiconductor device structures such as diode structures and/or transistor cells. The second cavity 205b may be completely formed within a portion of the semiconductor substrate 500a assigned to the semiconductor die of a finalized semiconductor device and at a distance to a side surface of the semiconductor die, wherein the side surface connects the first and second surfaces 101a, 102a of the finalized semiconductor die and wherein the second cavity 205b is effective as a chipping stop preventing cracks generated along the side surface from propagating into the active chip area. The side surface may be vertical to the first and second surfaces 101a, 102a.

According to another embodiment, the second cavity 205b is at least partly formed in a kerf area of the semiconductor substrate 500a and partially consumed during a process singularizing a plurality of identical semiconductor dies from the semiconductor substrate. According to a further embodiment, a plurality of second cavities 205b is formed along a line surrounding the active chip area, e.g., within a kerf area.

Figure 1F:
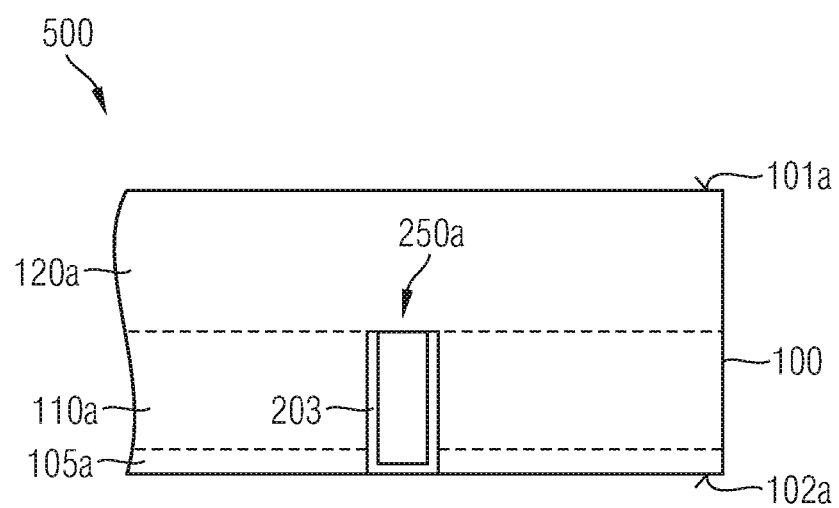
FIG. 1F is a schematic cross-sectional view of the semiconductor substrate portion of FIG. 1B after removing a portion of the base layer.

FIG. 1F refers to an embodiment with the first cavity 205a of FIG. 1B extending into the base layer 105. The base layer 105 may be only partly removed such that after thinning, a rear side insertion structure 250a based on the first cavity 205a of FIG. 1B extends into a remnant portion 105a of the base layer 105 of FIG. 1B.

FIGS. 2A to 2G show details of a method of forming rear side insertion structures using a masked epitaxial growth.

A base layer 105 includes a layer or layered structure of single-crystalline semiconductor material, e.g., silicon (Si), germanium (Ge), a silicon germanium crystal (SiGe), silicon carbide (SiC), gallium arsenide (GaAs), gallium nitride (GaN) or another $A_{III}B_V$ semiconductor. The base layer 105 may be a homogeneous layer or may include a base substrate 105a and at least one epitaxial layer 105b grown by epitaxy on the base substrate 105a, wherein a crystal lattice of the epitaxial layer 105b locks into the crystallographic orientations of the base substrate 105a. The base substrate 105a and the epitaxial layer 105b may have different conductivity types and/or different impurity concentrations. The epitaxial layer 105b may be n-doped or p-doped or intrinsic semiconductor material.

An auxiliary layer is formed on a surface of the base layer 105, for example by thermal treatment, e.g., oxidation of a portion of the base layer 105, and/or deposition, e.g., chemical vapor deposition (CVD), high density plasma (HDP) deposition or plasma enhanced chemical vapor deposition (PECVD). A photolithography process patterns the auxiliary layer to form one or more isolated, i.e. spatially separated auxiliary pads 201 from the auxiliary layer. The auxiliary pads 201 may be compact structures with the two lateral dimensions within the same order of magnitude or parallel stripes. According an embodiment, at least one auxiliary pad 201 may form a circumferential structure.

Figure 2A:
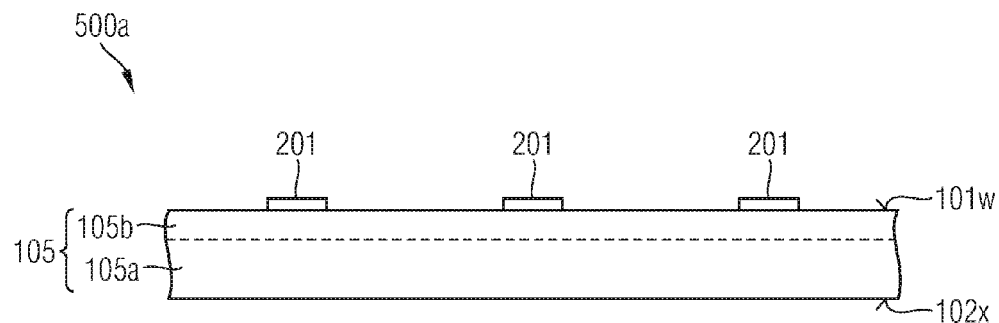
FIG. 2A is a schematic cross-sectional view of a portion of a semiconductor substrate for illustrating a method of manufacturing a semiconductor device in accordance with an embodiment that includes overgrowing cavities, after forming auxiliary pads.

FIG. 2A shows the auxiliary pads 201 on a surface 101w of the base layer 105. The auxiliary pads 201 may consist of or contain dielectric materials. The auxiliary pads 201 may exhibit a high grinding selectivity with respect to the material of the base layer 105. According to an embodiment, the auxiliary pads 201 consist of or contain, as main constituent, silicon oxide, silicon nitride, silicon oxynitride, carbon, or a combination of at least two of the mentioned materials.

A first semiconductor layer 110a is grown by epitaxy on the surface 101w of the base layer 105 including the auxiliary pads 201, wherein the epitaxial layer 105b may be effective as a seed. The auxiliary pads 201 locally suppress epitaxial growth in sections of the base layer 105 covered by the auxiliary pads 201. The impurity concentration in the first semiconductor layer 110a may be varied during epitaxial growth.

Figure 2B:
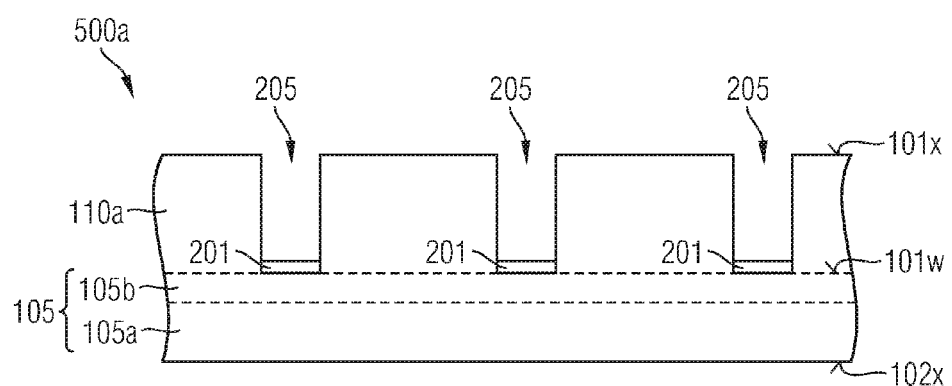
FIG. 2B is a schematic cross-sectional view of the semiconductor substrate portion of FIG. 2A after selectively growing a first semiconductor layer between the auxiliary pads.

FIG. 2B shows the first semiconductor layer 110a with cavities 205 formed in the vertical projection of the auxiliary pads 201. Sidewalls of the cavities 205 may be vertical to an exposed process surface 101x of the first semiconductor layer 110a opposite to the base layer 105 or may taper with decreasing distance to the process surface 101x.

According to other embodiments the cavities 205 may be formed as described with respect to FIG. 1A. For example, a continuous anisotropic etching process or a stepwise continuous anisotropic etching process may form the cavities 205 in the semiconductor material.

The two lateral dimensions of the cavities 205 may be within the same order of magnitude, e.g., approximately equal. For example, a lateral cross-section of the cavities 205 in a plane parallel to the process surface 101x may be a circle, an oval, an ellipse, or a rectangle with or without rounded corners. According to another embodiment, the cavities 205 may be straight stripes or stripes with sharp bends, curves, or branches. The semiconductor substrate 500a may include one or more circumferential cavities 205 in each semiconductor body 100 of semiconductor dies obtained from the semiconductor substrate 500a.

A mask layer 203a is formed on the process surface 101x as well as along the inner sidewalls of the cavities 205. Forming the mask layer 203a may include a thermal treatment of the semiconductor substrate 500a in an ambient containing oxygen and/or nitrogen and/or deposition of at least one mask material. According to an embodiment, forming the mask layer 203a includes a highly conformal deposition and/or a low conformal deposition, e.g., using TEOS (tetraethyl orthosilicate) as precursor material.

Figure 2C:
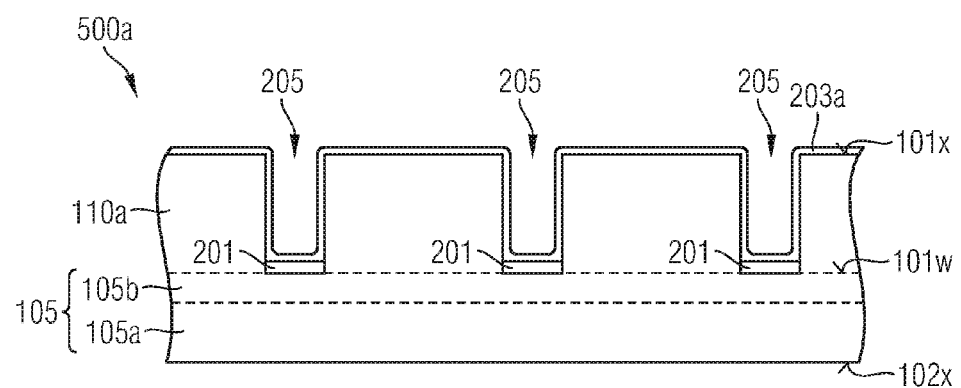
FIG. 2C is a schematic cross-sectional view of the semiconductor substrate portion of FIG. 2B after providing a mask layer.

FIG. 2C shows the mask layer 203a covering the process surface 101x as well as sidewalls of the cavities 205. At least a sub-layer of the mask layer 203a may cover the auxiliary pads 201.

According to an embodiment the mask layer 203a consists of or includes a sub-layer of thermally grown semiconductor oxide or semiconductor nitride, e.g. silicon oxide or silicon nitride in case the first semiconductor layer 110a is a silicon layer. According to another embodiment, the mask layer 203a is an approximately conformal layer. The mask layer 203a may include sub-layers provided from silicon oxynitride or silicon nitride. The mask layer 203a may include high-conformal sub-layers such that the mask layer 203a fills the cavities 205 completely.

According to a further embodiment, the mask layer 203a includes low-conformal layer(s), e.g., an HDP oxide that closes the cavities 205 with mask plugs, e.g. oxide plugs, leaving voids between the auxiliary pads 201 and the mask plugs. The mask layer 203a as well as the auxiliary pads 201 may exhibit a high grinding selectivity with respect to the first semiconductor layer 110a.

The mask layer 203a or the mask plugs may be recessed such that portions of the mask layer 203a or the mask plugs outside the cavities 205 and on portions of the sidewalls of the cavities 205 adjoining the process surface 101x are removed. For example, a mask layer 203a forming mask plugs may be isotropically recessed. For a mask layer 203a that does not form plugs in the cavities 205 a sacrificial material, e.g., a resist may be deposited and recessed to form resist plugs in portions of the cavities 205 oriented to the auxiliary pads 201. The resist plugs may be used as an etch mask during the recess of the mask layer 203a. After the recess of the mask layer 203a, the resist plugs may be removed.

Figure 2D:
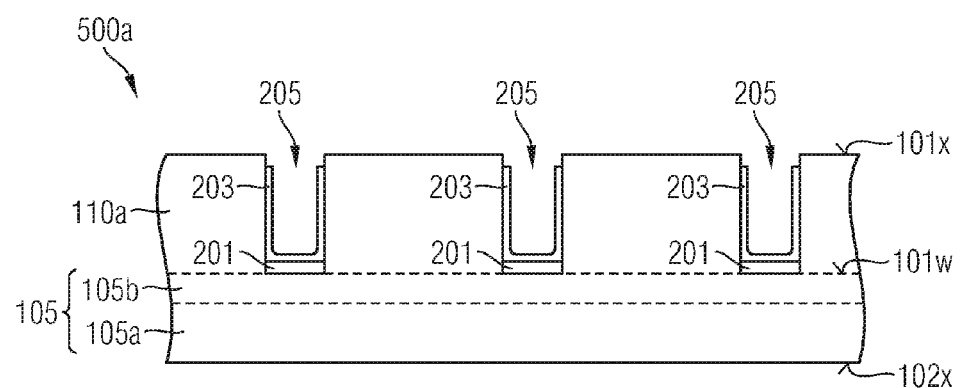
FIG. 2D is a schematic cross-sectional view of the semiconductor substrate portion of FIG. 2C after recessing the mask layer.

FIG. 2D shows a mask liner 203 formed from remnant portions of the mask layer 203a of FIG. 2C oriented to the auxiliary pads 201, whereas portions of the sidewalls of the cavities 205 oriented to the process surface 101x are exposed.

The semiconductor substrate 500a may be annealed in hydrogen containing ambient at high temperatures above 900 degree Celsius or above 1000 degree Celsius or between 1050 and 1150 degree Celsius for at least 5 minutes or at least 10 minutes or longer. Due to the high surface mobility of, e.g., silicon atoms in a hydrogen-containing atmosphere, the material of the first semiconductor layer 110a becomes viscous and a slow moving flow of viscid silicon occludes the cavities 205. When the cavities 205 are closed the anneal stops and the semiconductor material recrystallizes. The modified process surface 101y formed by the recrystallized semiconductor material may be planarized using, e.g., a polishing process.

Before or after planarization, an auxiliary mask layer may be deposited and opened in the vertical projection of the cavities 205 to form an auxiliary implant mask. Through the openings in the auxiliary implant mask, oxygen may be implanted at low-energy and high dose to form an oxide layer between the process surface 101x, 101y and the cavity 205. The oxide layer, the mask liner 203, and, if applicable, the auxiliary pads 201 may completely cover the inner surfaces of the cavities 205. The auxiliary implant mask may be removed after the oxygen implant.

Figure 2E:
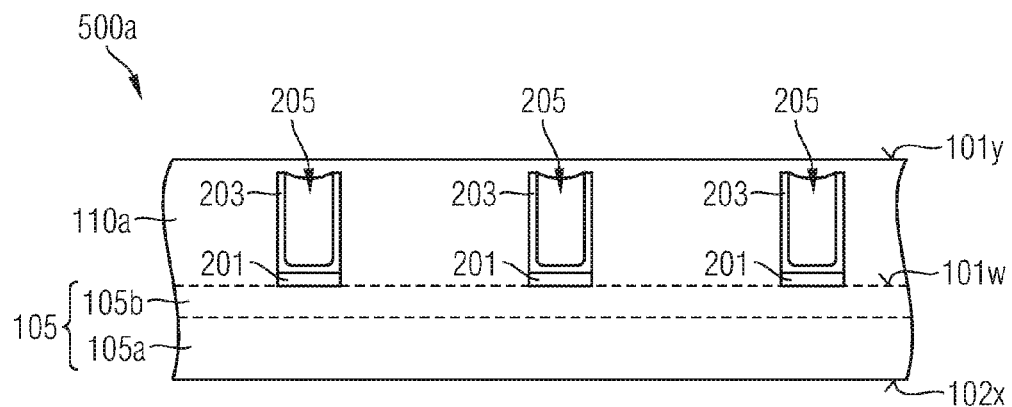
FIG. 2E is a schematic cross-sectional view of the semiconductor substrate portion of FIG. 2D after capping cavities in the first semiconductor layer.

FIG. 2E shows the recrystallized first semiconductor layer 110a capping and spanning the cavities 205. The cavities 205 form closed voids in the vertical projection of the auxiliary pads 201. According to other embodiments, the recrystallized first semiconductor layer 110a may fill the cavities 205 completely such that no voids are formed in the vertical projection of the auxiliary pads 201.

An epitaxy process grows a second semiconductor layer 120a on the planarized process surface 101y, wherein impurity concentration gradient and thickness of the second semiconductor layer 120a are set according to voltage blocking requirements and/or on-state resistance requirements of the finalized semiconductor device. The dopant concentration in the second semiconductor layer 120a may be equal to or lower than a dopant concentration in the first semiconductor layer 110a.

According to an embodiment, alignment marks may be formed by cavities which are sufficiently wide such that during annealing in the hydrogen-containing environment the viscid semiconductor material of the first semiconductor layer 110a does not occlude the cavities assigned to alignment marks and growing the second semiconductor layer 120a leaves voids above the concerned cavities.

Element structures of electronic components such as source regions and/or gate electrodes of transistor cells of IGFETs (insulated gate field effect transistors), JFETs (junction field effect transistors), IGBTs (insulated gate bipolar transistors), and/or thyristors, anode regions of semiconductor diodes or control electrodes of controllable semiconductor diodes as well as super junction and compensation structures may be formed in a control structure 615 by processes applied to the front side. The element structures may include impurity regions, conductive structures as well as insulating structures.

A carrier 900 may be attached to, e.g. adhered, bonded or mounted to the first surface 101a. The carrier 900 may be a glass carrier. According to an embodiment the carrier 900 may be a reusable polished silicon (di)oxide disk or a polished silicon disk.

Figure 2F:
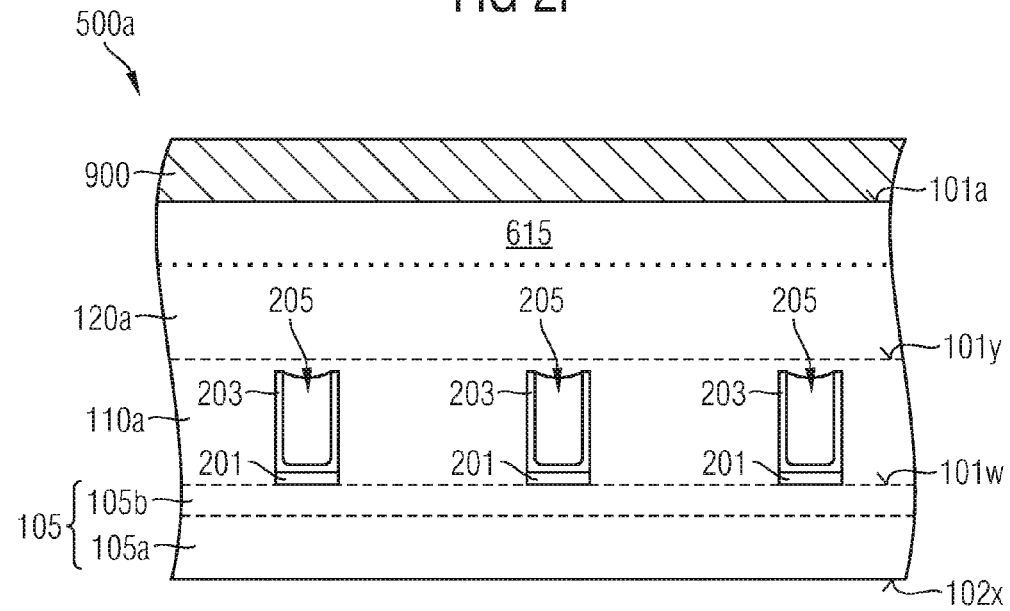
FIG. 2F is a schematic cross-sectional view of the semiconductor substrate portion of FIG. 2E after growing a second semiconductor layer by epitaxy.

FIG. 2F shows a first surface 101a of the semiconductor substrate 500a formed by a surface of the second semiconductor layer 120a opposite to the first semiconductor layer 110a. The carrier 900 is mounted on the front side defined by the first surface 101a. The element structures of the control structure 615 are predominantly formed closer to the front side defined by the first surface 101a than to an interface between the first semiconductor layer 110a and the base layer 105.

A grinding or polishing process removes the base layer 105 and thereby thins the semiconductor substrate 500a. The auxiliary pads 201 may be effective as etch stop structures and/or grinding stop and may provide an etch stop signal and/or grinding stop signal indicating exposure of the auxiliary pads 201 or another material in the interior of the cavities 205.

According to an embodiment the grinding process removes semiconductor material from an exposed surface of the base layer 105 up to an edge of the auxiliary pads 201 adjoining the base layer 105. According to another embodiment after exposure of the auxiliary pads 201 the grinding process may proceed by a preset time under preset grinding conditions such that the auxiliary pads 201 may be partly or completely removed.

Grinding includes any chipping with geometrically undefined cutting edge. At the beginning grinding may use a first grinding body, e.g., a grinding pad or grinding wheel, which has a rough surface, at a high down force to achieve a high removal rate. Before grinding is expected to reach the auxiliary pads 201, the first grinding body may be replaced with a second grinding body having a smoother surface and/or the down force may be reduced. For example, first the down force is reduced and later the grinding body is exchanged. With the grinding body reaching the auxiliary pads 201, the removal rate is significantly reduced resulting in a significant increase of power or torque needed to drive the grinding body. A higher torque results in a higher motor current of a motor driving the grinding body and grinding can be controlled by monitoring the drive current.

The auxiliary pads 201, which may be island-like pads, stripes or frames or another material in the interior of the cavities 205 impede a further removal of semiconductor material. The removal rate is significantly reduced resulting in a significant increase of a motor current driving the grinding body. The drive current and/or the spectral response of the grinded second surface 102 may be monitored to stop the grinding.

In case the semiconductor substrate 500a is tilted to the grinding surface of the grinding body, the auxiliary pads 201 block a further removal of material in portions of the semiconductor substrate 500a where the grinding process reaches the auxiliary pads 201 at first. As a result, the grinding process is self-adjusted and automatically compensates for a tilt angle between the initial back surface and the grinding surface of the grinding body. Depending on the rigidity of the material supporting the grinding body or the rigidity of the grinding body itself, it may occur that between the auxiliary pads, semiconductor material is further removed to a small extent leaving a dished curvature of the grinded second surface 102a. This effect can be controlled and minimized by proper selection of the grinding tools and grinding process.

Figure 2G:
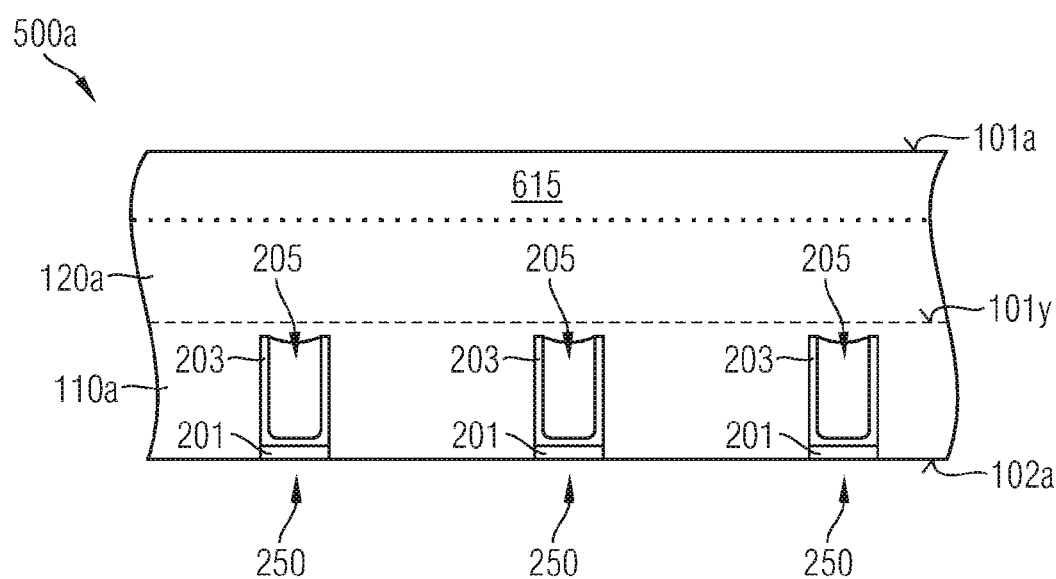
FIG. 2G is a schematic cross-sectional view of the semiconductor substrate portion of FIG. 2F after removing the base layer.

FIG. 2G shows the thinned semiconductor substrate 500a after separation from the carrier 900. The grinded second surface 102a at the rear side exposes the auxiliary pads 201, which may be removed in sections or completely. Further process steps effective from the rear side may be performed before or after separation from the carrier 900, for example implants for generating backside emitters or field stop zones and deposition processes for providing a backside metallization.

Rear side insertion structures 250 directly adjoining the second surface 102a are formed from the cavities 205. The rear side insertion structures 250 are formed at a stage where a high temperature budget is available such that the rear side insertion structures 250 may include materials whose formation/deposition is combined with a high temperature budget, e.g. thermally grown oxide.

The rear side insertion structures 250 may be solid dielectric structures or dielectric structures with voids that separate impurity zones at the rear side, e.g., p-doped and n-doped collector zones of RC-IGBTs. Dielectric rear side insertion structures may locally reduce collector efficiency in IGBTs or may reduce a wafer bowing induced by materials applied to the front side.

For example, forming a sufficient number of rear side insertion structures 250 in two orthogonal directions compensates for mechanical stress caused by thick oxide structures deposited at the front side as well as mechanical stress induced by components of the control structure 615, or thermo-mechanical stress induced at an intersection between the semiconductor body 100 and a solder layer connecting the semiconductor body 100 with a carrier substrate, e.g. a DCB (direct copper bond) substrate or a PCB (printed circuit board), or between the solder layer and the carrier substrate.

According to other embodiments the rear side insertion structures 250 may be auxiliary structures temporarily filled with materials containing impurities that diffuse out during manufacturing and that locally form impurity zones at a distance to the second surface 102. The impurity zones may be used for field shaping, charge carrier lifetime adjustment or avalanche definition, by way of example. Other embodiments may provide rear side insertion structures 250 effective as alignment marks or chipping stopper.

According to further embodiments the cavities may be opened, e.g., by a selective etch process, e.g., by removing the auxiliary pads 201 and, if applicable, portions of the mask liner 203. Opening the cavities 205 may include further processes for removing material from the interior of the cavities 205. Impurities may be implanted from the rear side through the exposed bottom and sidewalls of the reopened cavities 205 with or without a lateral patterning aligned to the cavities 205. Subsequently, the reopened cavities 205 may be refilled, e.g. with a dielectric material, for example using low-temperature CVD (chemical vapor deposition) or a spin-on process to form the finalized rear side insertion structure 250.

FIGS. 3A and 3B refer to a semiconductor device 500 whose edge termination area 695 includes circumferential rear side insertion structures 250.

The semiconductor device 500 includes at least one pn-junction in a semiconductor body 100 and a load current path between a first and a second load electrode 310, 320. The semiconductor device 500 may be a lateral device with both load electrodes 310, 320 arranged at a front side defined by a first surface 101 of the semiconductor body 100.

According to the illustrated embodiment, the semiconductor device 500 is a vertical device with the load electrodes 310, 320 arranged on opposing sides of the semiconductor body 100.

The semiconductor device 500 may be or may include a semiconductor diode, e.g., a controllable semiconductor diode, an IGFET, a JFET, an IGBT, e.g., an RC-IGBT (reverse-conducting IGBT), or a thyristor, for example a GTO (gate-turn-off thyristor) or a GCT (Gate commutated thyristor), by way of example. The semiconductor device 500 may include a super junction or compensation structure. The material of the semiconductor body 100 is a single crystalline semiconductor material, for example silicon Si, silicon carbide SiC, germanium Ge, a silicon germanium crystal SiGe, gallium nitride GaN or gallium arsenide GaAs or another $A_{III}B_V$ semiconductor. Directions parallel to the first surface 101 are lateral directions and a normal to the first surface 101 defines a vertical direction.

The semiconductor body 100 includes a drift zone 120 of a first conductivity type and a pedestal layer 130 of the first or a second conductivity type complementary to the first conductivity type. The pedestal layer 130 extends parallel to a second surface 102 of the semiconductor body 100 parallel to the first surface 101. In the drift zone 120 the impurity concentration may be uniform or may gradually increase or decrease with decreasing distance to the second surface 102. The impurity concentration in the drift zone 120 may be between 5E12 and 5E14 cm$^{-3}$, by way of example.

A field stop layer 128 or a buffer layer may be arranged between the drift zone 120 and the pedestal layer 130. In the illustrated embodiment the field stop layer 128 separates the pedestal layer 130 from the drift zone 120. A maximum impurity concentration in the field stop layer 128 is at least five times, e.g. ten times as high as a maximum impurity concentration in the drift zone 120. The drift zone 120 and the field stop layer 128 form a unipolar semiconductor junction, e.g. an nn$^-$ junction or pp$^-$ junction, which is approximately parallel to the second surface 102. The drift zone 120 may form a pn junction or a unipolar semiconductor junction, e.g. an nn$^+$ junction or pp$^+$ junction, with the pedestal layer 130.

In an active area 610 the semiconductor device 500 includes a device-specific control structure 615 between the first surface 101 and the drift zone 120. An edge termination area 690 surrounding the active area 610 and separating the active area 610 from an outer surface 103 that connects the first and second surfaces 101, 102 may include an edge termination structure 695 including, e.g., a lateral variation of doping, a field plate structure, trench termination structures and/or guard rings adjoining the first surface 101, respectively.

The outer surface 103 may include sections perpendicular to the first surface 101. For example, the outer surface 103 may include a first section adjoining the first surface 101 and resulting from a trench etch as well as a second section adjoining the second surface 102 and resulting from a mechanical separation process such as sawing.

The control structure 615 may include element structures such as anode regions of a semiconductor diode, control structures of controllable diodes or source regions 110, body regions 115 and gate structures 150 of transistor cells TC. The element structures are predominantly closer to the first surface 101 on the front side than to the second surface 102 on the rear side.

At the rear side an insertion structure 250 extends from the second surface 102 into the semiconductor body 100. In case of a stepped outer surface 103 the lateral projection of the insertion structure 250 may overlap with a section obtained from a trench etch process.

The insertion structure 250 may include dielectric material(s), semiconducting material(s), and/or conductive materials, phase change materials, and/or a void which prevent cracks and fissures induced by, e.g., a mechanical separation process at the outer surface 103 from penetrating into the active area 610 of the semiconductor body 100. For example, the insertion structure 250 includes a semiconductor oxide layer, e.g., a silicon oxide layer or silicon oxynitride layer along the interfaces with the semiconductor body 100. The insertion structure 250 may be completely filled or may contain a void lined by dielectric materials.

A vertical dimension of the insertion structure 250 may be between 0.2 micrometer and 10 micrometer, for example at least 1 micrometer. A lateral width of the insertion structure 250 may range from 0.1 pin to several micrometers.

According to the embodiment illustrated in FIGS. 3A and 3B, the insertion structure 250 is a circumferential structure and surrounds a portion including the active area 610 of the semiconductor body 100 at a distance to the outer surface 103. A void 255 in the insertion structure 250 may stop the propagation of cracks generated at the outer surface 103 during a separation process separating a semiconductor substrate into a plurality of semiconductor dies, wherein the cracks later can propagate through the edge termination area 695 into the active area 610. The insertion structure 250 may also getter impurity atoms, for example copper atoms, from passing through the edge termination area 690 into the active area 610.

FIGS. 4A and 4B refer to other embodiments with insertion structures 250 in the edge termination area 690 at the rear side. The insertion structures 250 are at least temporarily filled with a material containing impurities, for example donor and/or acceptor impurities. The impurities diffuse out of the insertion structures 250 and may form local n-type or p-type impurity zones 127 in which the impurity concentration decreases with increasing distance from the respective insertion structure 250 both in the lateral directions and in the vertical direction.

According to an embodiment referring to IGBTs, the local impurity zones 127 may have the conductivity type of the pedestal layer 130 and extend from the respective insertion structure 250 into the drift zone 120 such that in the edge termination area 690 a rear side pn-junction of the drift zone 120 with the pedestal layer 130 and the local impurity zones 120 is shifted away from the second surface 102. At the outer surface 103 a distance between the pn-junction and the second surface 102 is increased. When the second load electrode 320 is soldered onto a carrier such as a DCB (direct copper bonding) board, a PCB (printed circuit board) or a lead frame, solder material is allowed to flow a greater distance from the rear side along the outer surface 103 without provoking a short-circuit of the pn-junction.

According to another embodiment the insertion structures 250 locally decrease the collector efficiency. Less charge carriers flood the edge termination area 690 in an on-state of an IGBT or the reverse conducting mode of an RC-IGBT such that commutation characteristics of the semiconductor device 500 are improved.

The insertion structure 250 may be combined with HDR (high dynamic robustness) approaches. For example, the edge termination area 690 may include an emitter efficiency reduction zone reducing the charge carrier injection from the pedestal layer 130 into the edge termination area 690 resulting in a reduced dynamic avalanche in the area of the junction termination.

According to the embodiment illustrated in FIG. 4B a plurality of insertion structures 250 are arranged along a circumferential line surrounding the active area 610 in the edge termination area 690.

Figure 5A:
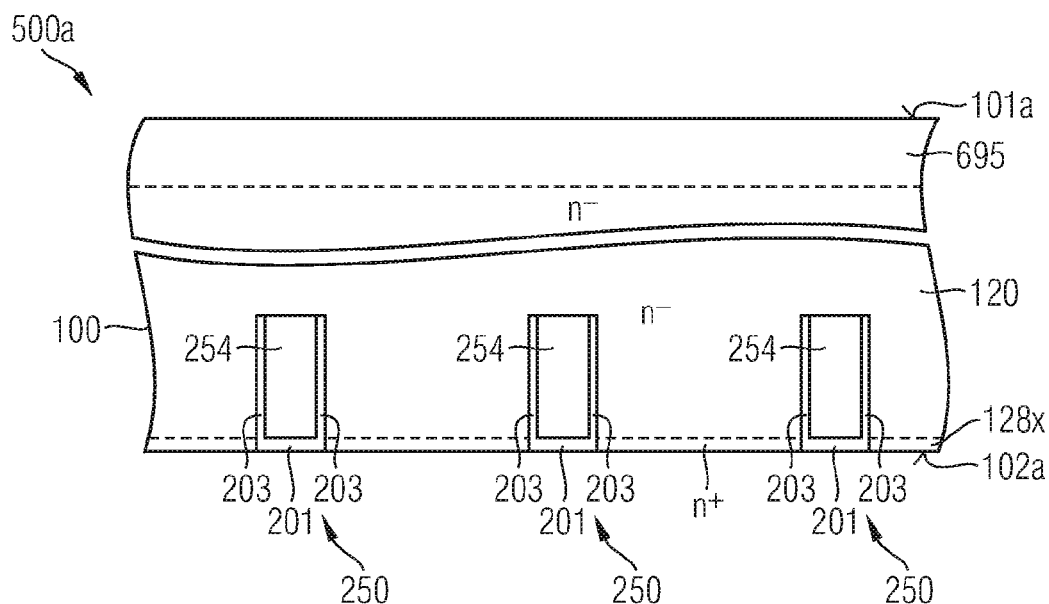
FIG. 5A is a schematic cross-sectional view of a portion of a semiconductor substrate for illustrating a method of manufacturing a semiconductor device in accordance with an embodiment providing field stop portions formed along insertion structures at a rear side, after providing insertion structures with a process material containing impurities.
Figure 5B:
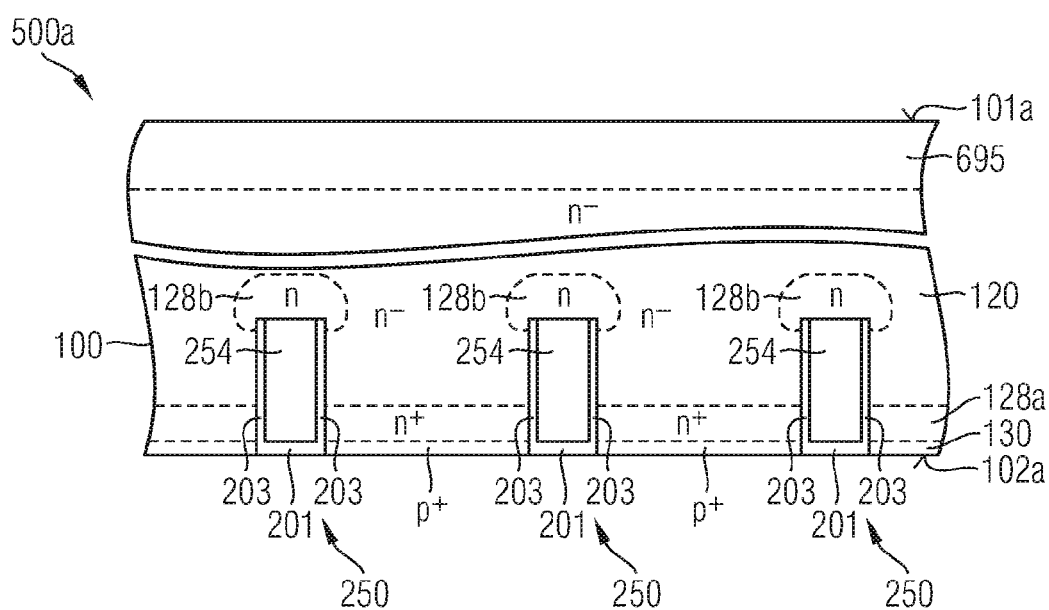
FIG. 5B is a schematic cross-sectional view of the semiconductor substrate portion of FIG. 5A after out-diffusion of the impurities.

FIGS. 5A to 5B refer to a semiconductor device 500 with impurities introduced through rear side insertion structures 250 shaping a field stop layer 128 in a semiconductor body 100.

According to an embodiment n-type impurities may be introduced through the second surface 102a, for example by an implant, to form an implanted layer 128x along the second surface 102a.

In the semiconductor body 100 insertion structures 250 extending from the second surface 102a into the semiconductor body and including a process material 254 may be formed using one of the above-described methods.

The insertion structures 250 may be formed as solid structures including a process material 254 containing n-type impurities in case of a semiconductor device 500 with an n-type drift zone 120, e.g. polycrystalline or single-crystalline silicon. According to another embodiment, the insertion structures 250 may be formed as trench-like structures including voids lined by a mask liner 203, wherein the process material 254 is filled into the voids from the rear side and wherein the mask liner 203 may be removed before providing the process material 254. According to a further embodiment, the insertion structures 250 are formed from a sacrificial material that may be replaced with the process material 254. The insertion structures 250 may further include auxiliary pads 201 from a dielectric material. Other embodiments may be devoid of the auxiliary pads 201.

FIG. 5A shows the implanted layer 128x along the second surface 102 as well as the insertion structures 250 containing the process material 254. The process material 254 may be provided only in a vertical section of the insertion structure 250 or may extend over the complete vertical extension of the insertion structure 250. In case the process material 254 is provided before front side processing, the process material 254 may include slowly diffusing impurities such as arsenic As or phosphorus P. In case the process material 254 is provided after front side processing, the process material 254 may include fast diffusing impurities such as selenium Se.

An anneal process induces a diffusion of the n-type impurities to form a field stop layer portion 128a in the semiconductor body 100 as illustrated in FIG. 5B. According to embodiments providing the original insertion structures 250 from the process material 254, the n-type impurities can be diffused out from the process material 254 during processes at the front side 101 and no dedicated thermal anneal has to be provided for diffusing out the n-type impurities from the process material 254. N-type impurities introduced through the rear side insertion structures 250 form trench-aligned field stop zones 128b directly adjoining the drift zone 120 in the semiconductor body 100. N-type impurities introduced through the first surface 101 form a continuous field stop layer portion 128a.

The diffusion process may be stopped before the trench-aligned field stop zones 128b and the field stop layer portion 128a have merged. According to another embodiment, the diffusion process is stopped after the trench-aligned field stop zones 128b merge with the field stop layer portion 128a. The impurity concentration of the trench-aligned field stop zones 128b has a lateral gradient and decreases with increasing distance to the insertion structures 250 both in the lateral and vertical directions. The trench-aligned field stop zones 128b and the field stop layer portion 128a form a graded or stepped field stop layer.

Out-diffusion from the insertion structure 250 may be masked by the mask liner 203 such that the impurities mainly diffuse out from a buried edge of the insertion structures 250 opposite to the second surface 102a. According to an embodiment, a pedestal layer 130 may be formed together with or after the field stop layer 128. After the diffusion process the process material 254 may be removed or replaced with another material. For further details reference is made to the description of FIGS. 3A to 4B.

Figure 6:
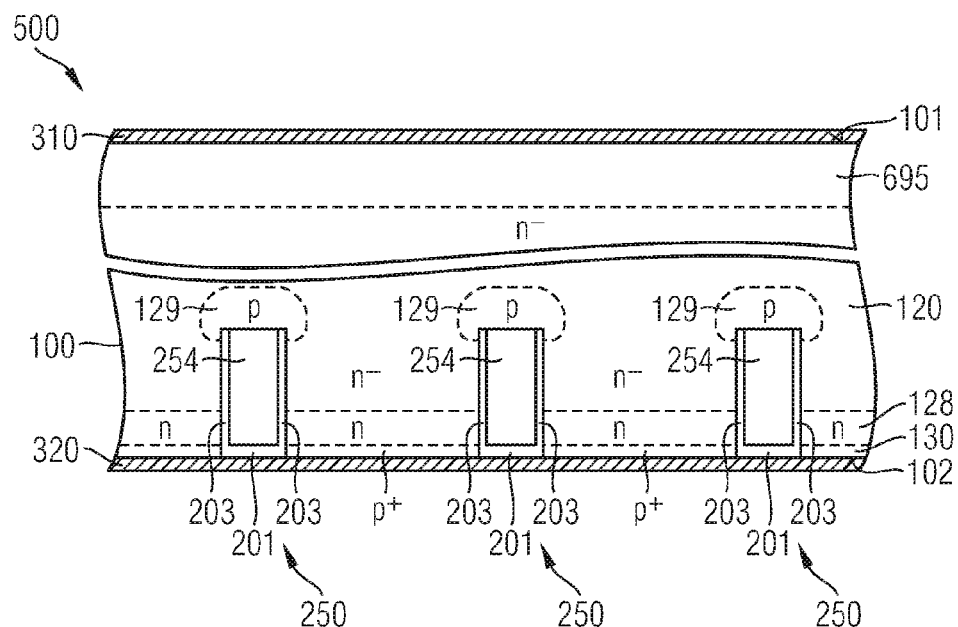
FIG. 6 is a schematic cross-sectional view of a portion of a semiconductor device according to an embodiment with counter-doped islands formed along insertion structures at a rear side.

FIG. 6 illustrates a semiconductor device 500, e.g., an IGBT, a semiconductor diode or a power IGFET with counter-doped islands 129 in portions of the drift zone 120 oriented to the second surface 102, wherein the illustrated embodiment refers to a semiconductor device 500 with an n-type drift zone 120 and p-doped counter-doped islands 129. The counter-doped islands 129 may be formed using the method described with reference to FIGS. 5A to 5B, wherein the process material 254 in the insertion structures 250 contains p-type impurities instead of n-type impurities. For further details reference is made to the description of FIGS. 3A and 3B.

The process material 254 may be heavily doped polycrystalline silicon that may be recrystallized after out-diffusion of the impurities to reduce a leakage current occurring in a reverse operation mode. According to another embodiment, the insertion structures 250 are initially provided from single-crystalline material containing impurities of a suitable conductivity type, wherein the single-crystalline material may directly adjoin the material of the semiconductor body 100.

The insertion structures 250 may have approximately equal widths and lengths. For example a lateral cross-section of the insertion structures 250 parallel to the first surface 101 may be a regular circle, an ellipsoid, an oval or a rectangle with or without rounded corners. According to another embodiment, at least some of the insertion structures 250 may be stripe-shaped with a length significantly exceeding the width. The stripes may be straight, bowed, sharply bended and/or branched. A plurality of insertion structures 250 may be distributed in the semiconductor body 100. The insertion structures 250 may be uniformly distributed. According to other embodiments a population density of the insertion structures increases or decreases with increasing distance to a center of the semiconductor device 500.

Figure 7:
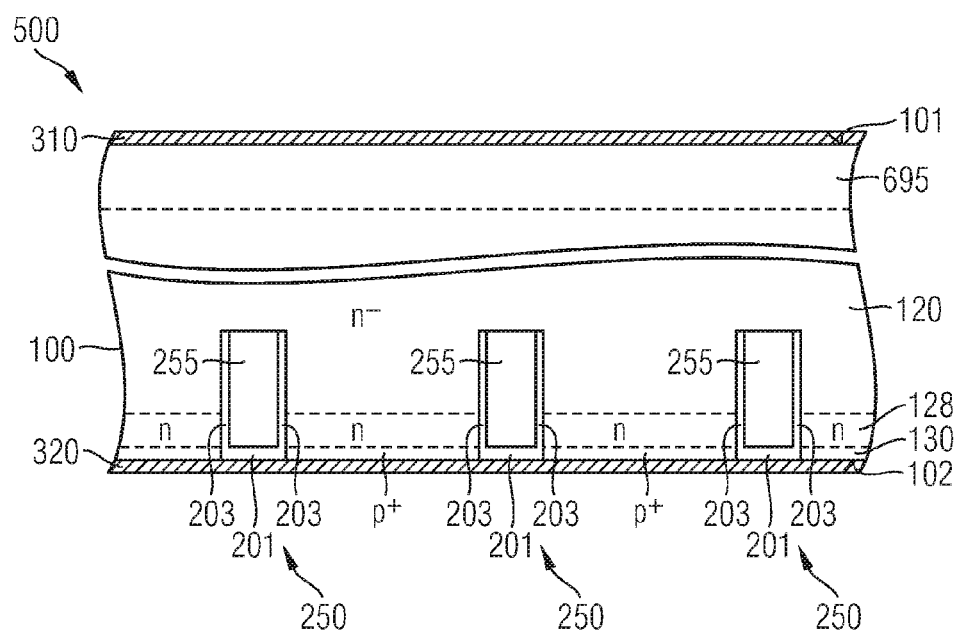
FIG. 7 is a schematic cross-sectional view of a portion of a semiconductor device according to an embodiment with rear side insertion structures including phase change material.

FIG. 7 refers to an embodiment with rear side insertion structures 250 containing a highly thermally conductive material 255 that enhances short circuit robustness. According to an embodiment the highly thermally conductive material 255 is a phase change material (PCM). The PCM may exhibit a solid-solid or solid-liquid phase change at a phase transition temperature Tc between 150° C. and 400° C., for example between 200° C. and 300° C.

According to an embodiment the PCM may be crystalline below a phase transition temperature Tc and amorphous above the phase transition temperature Tc. A short high-current pulse in a portion of the semiconductor body 100 adjoining an insertion structure 250 may heat the PCM up to the phase change temperature Tc such that the PCM performs a phase transition from crystalline to amorphous within a short time period, e.g. within a period between 50 ns to 200 ns. The phase change absorbs latent heat from the semiconductor body 100 while keeping the phase change temperature Tc. The PCM acts as a heat sink effectively dissipating heat and counteracts local heating effects which otherwise may damage the semiconductor device 500. The phase change of the PCM is reversible and amorphous portions of the PCM may be reconverted into the crystalline phase form by an appropriate process, e.g. by a recovery anneal. The recovery anneal may use a moderate recovery current applied over an extended time. The recovery current heats the amorphous material up to the crystallization temperature and keeps the amorphous material at this temperature until nucleation begins and the material starts recrystallization. The recovery anneal may be carried out during normal operation of the semiconductor device 100.

The PCM may contain a salt or salt hydrate, for example $M_nH_2O$, an organic PCM, for example $C_nH_{2n+2}$, or may be an eutectic compound of PCMs that have characteristic phase transition temperatures TC and latent heats. According to an embodiment the PCM contains a chalcogenide, e.g. GeSbTe (Germanium-Antimony-Tellurium or GST).

According to another embodiment the highly thermally conductive material 255 comprises CVD deposited diamond layers or any other highly thermally conducting material. For further details reference is made to the description of FIGS. 3A and 3B and FIG. 6.

According to other embodiments similar to that described with reference to FIG. 7, the insertion structures 250 include voids that may compensate for deformations and that may reduce the mechanical stress in the semiconductor device 500. The voids may further compensate for mechanical stress occurring during processing of the semiconductor device 500 in a wafer composite. As a result, the semiconductor device 500 includes less defects, for example cracks, and shows a better long-term stability.

Figure 8:
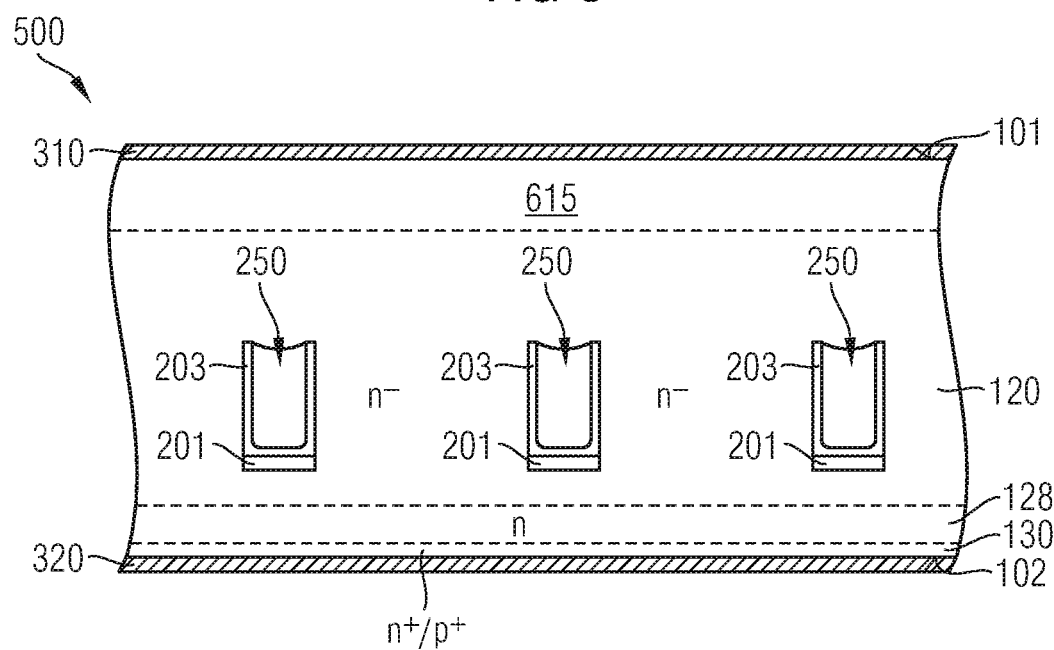
FIG. 8 is a schematic cross-sectional view of a portion of a semiconductor device according to an embodiment with voids or dielectric islands along an interface between a base layer and a first semiconductor layer.

FIG. 8 shows a semiconductor device 500, e.g. a semiconductor diode, an IGFET, or an IGBT with or without a super junction structure and with buried insertion structures 250 formed in a semiconductor body 100 at a distance to both the first and second surfaces 101, 102. The insertion structures 250 may be solid structures including conductive and/or dielectric sub-layers, or may include voids and no, one or more mask liners lining the voids. For further details reference is made to the description of FIGS. 3A and 3B and FIG. 6.

The buried insertion structures 250 may stop the propagation of sliding surfaces and line defects and/or may compensate for mechanical strain in the semiconductor body 100. Further, the buried insertion structures 250 may getter contamination atoms, for example oxygen or copper atoms. The buried insertion structures 250 may be formed as described with reference to FIGS. 1A to 1E or 2A to 2G, wherein other than the rear side insertion structures of FIGS. 1A to 1E or 2A to 2G the thinning may be completely omitted or may stop at a distance to the buried insertion structures 250.

According to a further embodiment a semiconductor device includes a semiconductor body including a first surface at a front side and a second surface parallel to the first surface at a rear side as well as element structures predominantly formed closer to the first surface than to the second surface; and an insertion structure extending from the second surface into the semiconductor body and including a phase change material.

According to a further embodiment a semiconductor device includes a semiconductor body with a first surface at a front side and a second surface parallel to the first surface at a rear side as well as element structures predominantly formed closer to the first surface than to the second surface as well as a base layer along the second surface and a semiconductor layer between the first surface and the base layer; and a dielectric structure including a void in the semiconductor layer, the dielectric structure adjoining an interface between the semiconductor layer and the base layer.

According to a further embodiment a method of manufacturing a semiconductor device includes forming a cavity in a first semiconductor layer that is formed on a semiconducting base layer, wherein the cavity extends from a process surface of the first semiconductor layer to the base layer and growing a second semiconductor layer on the process surface by epitaxy, wherein the second semiconductor layer spans the cavity.

The growing by epitaxy may leave a void in the vertical projection of the cavity and the method further comprises depositing a photoresist layer on the second semiconductor layer, adjusting an illumination mask of a photolithography apparatus to the cavity by evaluating an optical response of the cavity, and exposing the photoresist layer to an illumination beam passing or being reflected by the illumination mask.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a cavity in a first semiconductor layer formed on a semiconducting base layer, the cavity extending from a process surface of the first semiconductor layer at least down to the base layer;
   forming a recessed mask liner on a portion of a sidewall of the cavity distant to the process surface or a mask plug in a portion of the cavity distant to the process surface;
   growing a second semiconductor layer on the process surface by epitaxy, the second semiconductor layer spanning the cavity;
   filling the cavity at least partly with a process material containing impurities; and
   annealing the process material to diffuse out the impurities from the process material to form an impurity zone in the semiconductor body, the impurity zone directly adjoining the filled cavity and an impurity concentration of the impurities diffused into the impurity zone decreasing with increasing distance to the filled cavity.

2. The method of claim 1, wherein the cavity is etched into the first semiconductor layer.

3. The method of claim 1, further comprising:
   capping the cavity by annealing the first semiconductor layer in a hydrogen-containing ambient before growing the second semiconductor layer, wherein material of the first semiconductor layer occludes the cavity.

4. The method of claim 1, further comprising:
   removing at least a portion of the base layer after growing the second semiconductor layer, wherein the cavity or a material in the cavity is exposed.

5. The method of claim 1, wherein the process material is filled into a plurality of spatially separated cavities and the impurity zones adjoining the filled cavities form a contiguous layer.

6. The method of claim 5, wherein an impurity concentration in the process material in the filled cavities varies in a vertical direction vertical to an interface between the first and second semiconductor layers.

7. The method of claim 1, wherein the process material is polycrystalline semiconductor material, the method further comprising:
   transforming the polycrystalline semiconductor material into single-crystalline semiconductor material.

8. The method of claim 1, wherein the process material is single-crystalline semiconductor material.

9. A method of manufacturing a semiconductor device, the method comprising:
   forming a cavity in a first semiconductor layer formed on a semiconducting base layer, the cavity extending from a process surface of the first semiconductor layer at least down to the base layer;
   forming a recessed mask liner on a portion of a sidewall of the cavity distant to the process surface or a mask plug in a portion of the cavity distant to the process surface;
   growing a second semiconductor layer on the process surface by epitaxy, the second semiconductor layer spanning the cavity; and
   forming, in the cavity, a recombination structure with a recombination velocity of at least 1E5 cm/s or a phase change material.

10. A method of manufacturing a semiconductor device, the method comprising:
    forming a cavity in a first semiconductor layer formed on a semiconducting base lay the cavity extending from a process surface of the first semiconductor layer at least down to the base layer;
    forming a recessed mask liner on a portion of a sidewall of the cavity distant to the process surface or a mask plug in a portion of the cavity distant to the process surface;
    growing a second semiconductor layer on the process surface by epitaxy, the second semiconductor layer spanning the cavity;
    removing at least a portion of the base layer after growing the second semiconductor layer, wherein the cavity or a material in the cavity is exposed;
    selectively removing material from an interior of the cavity;
    implanting impurities through exposed sidewalls and bottoms of the exposed cavities; and
    at least partly refilling the cavities.

* * * * *

UNITED STATES PATENT AND TRADEMARK OFFICE
CERTIFICATE OF CORRECTION

PATENT NO. : 9,640,401 B2  
APPLICATION NO. : 15/188472  
DATED : May 2, 2017  
INVENTOR(S) : J. Laven et al.

Page 1 of 1

It is certified that error appears in the above-identified patent and that said Letters Patent is hereby corrected as shown below:

In the Claims

Column 18, Line 7 (Claim 10, Line 4), please change "lay" to -- layer --.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*